United States Patent
Nakano

(10) Patent No.: US 7,849,357 B2
(45) Date of Patent: Dec. 7, 2010

(54) SEMICONDUCTOR MEMORY DEVICE AND CONTROL METHOD THEREOF

(75) Inventor: Takeshi Nakano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 750 days.

(21) Appl. No.: 11/767,756

(22) Filed: Jun. 25, 2007

(65) Prior Publication Data

US 2008/0005530 A1  Jan. 3, 2008

(30) Foreign Application Priority Data

Jun. 30, 2006  (JP) .............................. 2006-182435

(51) Int. Cl.
  *G06F 11/00* (2006.01)
(52) U.S. Cl. ............................................ 714/8; 714/5
(58) Field of Classification Search ...................... 714/8, 714/5, 6, 7, 42, 54
  See application file for complete search history.

(56) References Cited

U.S. PATENT DOCUMENTS

| | | | | | |
|---|---|---|---|---|---|
| 5,335,328 | A | * | 8/1994 | Dunn et al. .................... | 710/33 |
| 5,459,850 | A | * | 10/1995 | Clay et al. .................... | 711/171 |
| 5,740,349 | A | * | 4/1998 | Hasbun et al. ................. | 714/8 |
| 6,845,438 | B1 | | 1/2005 | Tanaka et al. | |
| 7,139,864 | B2 | * | 11/2006 | Bennett et al. .............. | 711/103 |
| 7,328,301 | B2 | * | 2/2008 | Eilert et al. ................. | 711/103 |

OTHER PUBLICATIONS

U.S. Appl. No. 11/683,604, filed Mar. 8, 2007, Takeshi Nakano.

* cited by examiner

*Primary Examiner*—Dieu-Minh Le
(74) *Attorney, Agent, or Firm*—Oblon, Spivak, McClelland, Maier & Neustadt, L.L.P.

(57) ABSTRACT

A semiconductor memory device has a semiconductor memory which includes the first central management block storing an address translation table, a free table for registering only an effective block address, the first bad block table, and a reserved table, and a controller configured to control a substitution block address acquired from the reserved table to substitute a bad block address when the bad block address is generated in the address translation table.

17 Claims, 9 Drawing Sheets

| Pin No. | Signal |
|---|---|
| Pin 1 | Card detection / data 3 (DAT3) |
| Pin 2 | Command (CMD) |
| Pin 3 | Vss |
| Pin 4 | Vdd |
| Pin 5 | Clock (CLK) |
| Pin 6 | Vss |
| Pin 7 | Data 0 (DAT0) |
| Pin 8 | Data 1 (DAT1) |
| Pin 9 | Data 2 (DAT2) |

Data format in free table

Data format in BB table

Data format in reserved table

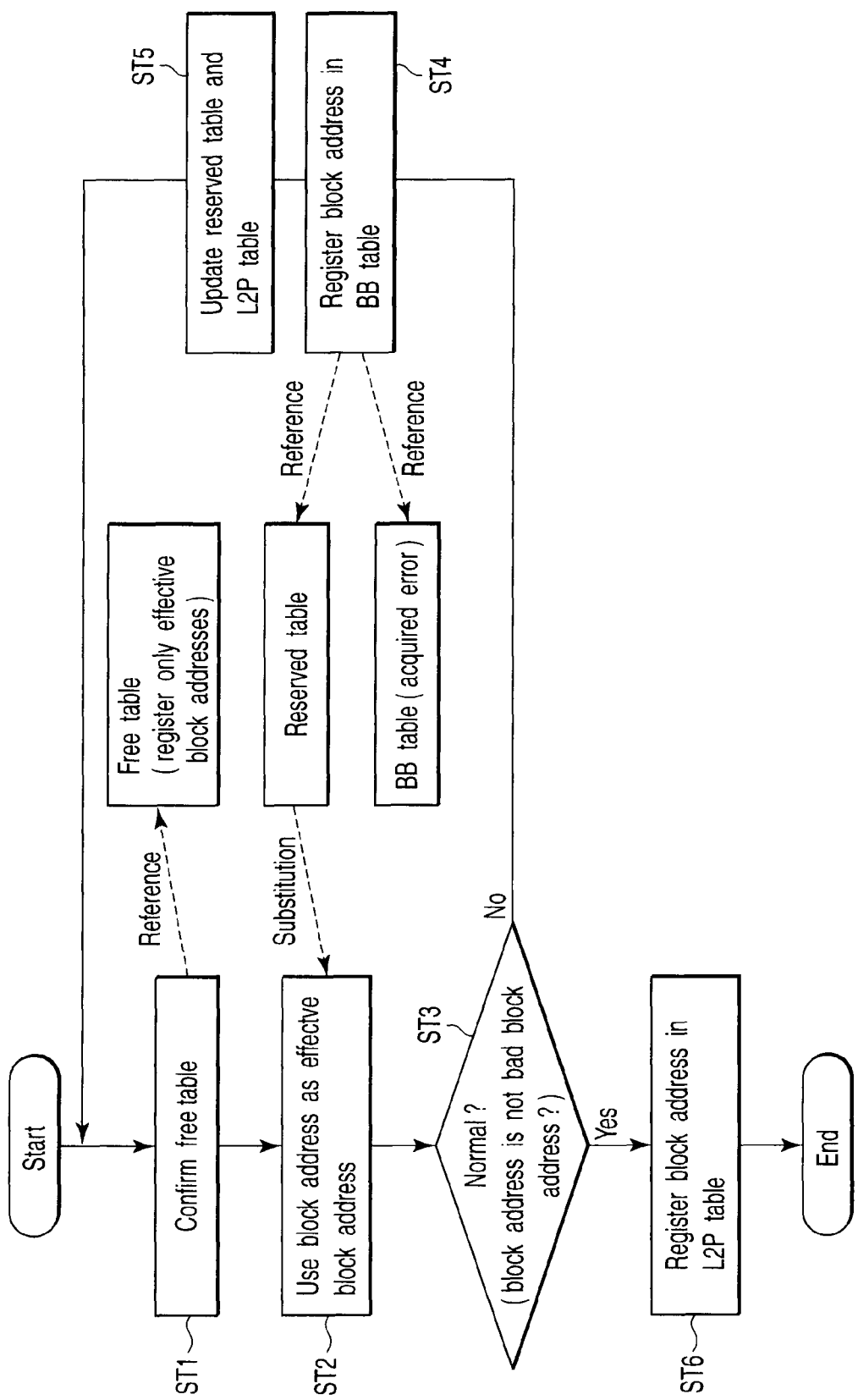
F I G. 11

Data format in conventional AT table
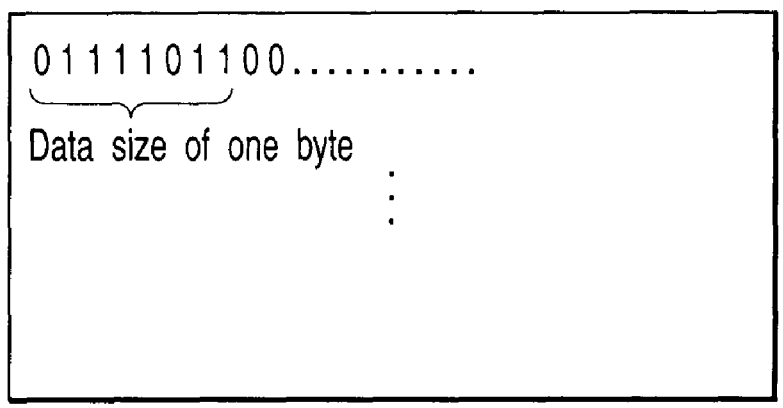
F I G. 1 4 (PRIOR ART)
Data format in conventional BB table
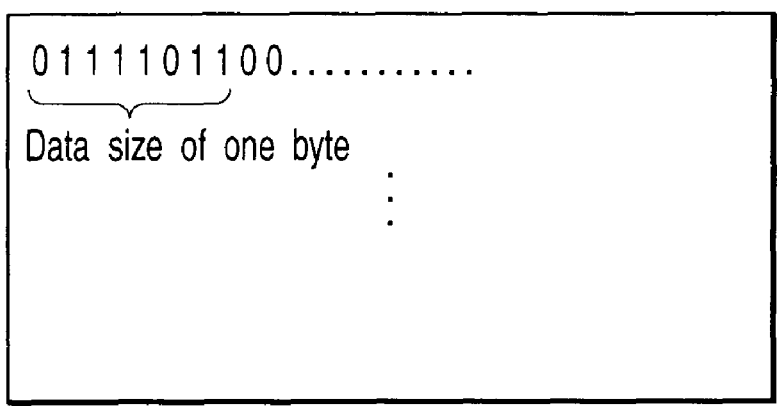
F I G. 1 5 (PRIOR ART)

SEMICONDUCTOR MEMORY DEVICE AND CONTROL METHOD THEREOF

CROSS-REFERENCE TO RELATED APPLICATIONS

This application is based upon and claims the benefit of priority from prior Japanese Patent Application No. 2006-182435, filed Jun. 30, 2006, the entire contents of which are incorporated herein by reference.

BACKGROUND OF THE INVENTION

1. Field of the Invention

The present invention relates to a semiconductor memory device and control method thereof and, more particularly, to a memory card based on an address translation table scheme of associating, in a one-to-one correspondence, a logical block address used when a host apparatus externally accesses a memory with a physical block address (actual block address) in the memory.

2. Description of the Related Art

A memory card which uses a nonvolatile semiconductor memory such as a flash memory serves as a medium for recording music and video data (e.g., see U.S. Pat. No. 6,845,438). One example of such flash memory used in a memory card is a NAND flash™ memory.

When writing data in the NAND flash™ memory, data must be written after erasing data in a block serving as a minimum erasable unit. Accordingly, when writing data, an erased block (erasure block) is first prepared, and a page to be rewritten and data not to be rewritten in a block need be copied in the erasure block.

Since such erasure block is generated, a memory controller must complexly manage a plurality of physical tables allocated on a RAM based on the address translation table (L2P (Logical to Physical) table) scheme.

Thus, the numbers of determination and detection processes increase, the processing speed decreases, and the complexity of processes increases to manage the above described physical tables. Such determination and detection processes need to be frequently performed in a normal rewrite operation of write/erase access. This largely influences and degrades the performance of the entire memory.

BRIEF SUMMARY OF THE INVENTION

According to an aspect of the present invention, there is provided a semiconductor memory device comprising a semiconductor memory which includes a first central management block storing an address translation table, a free table for registering only an effective block address, a first bad block table, and a reserved table, a controller which controls a substitution block address acquired from the reserved table to substitute a bad block address when the bad block address is generated in the address translation table.

According to another aspect of the present invention, there is provided a control method of a semiconductor memory device having a semiconductor memory which includes a central management block storing an address translation table, a free table for registering only an effective block address, a bad block table, and a reserved table, and a controller, the method comprising, causing the controller to register a bad block address in a first bad block table when the bad block address is generated in the address translation table, acquiring a substitution block address from the reserved table, and substituting the substitution block address for the bad block address.

BRIEF DESCRIPTION OF THE SEVERAL VIEWS OF THE DRAWING

FIG. 11 is a flowchart showing table management operations in rewiring data stored in the flash memory according to the embodiment;

FIG. 14 is a view showing table management operations (ST1 to ST6) of a semiconductor memory device according to a prior art; and FIG. 15 is a view showing a table management operation (ST3 to ST5) of the semiconductor memory device according to the prior art.

DETAILED DESCRIPTION OF THE INVENTION

Figures 1, 2:
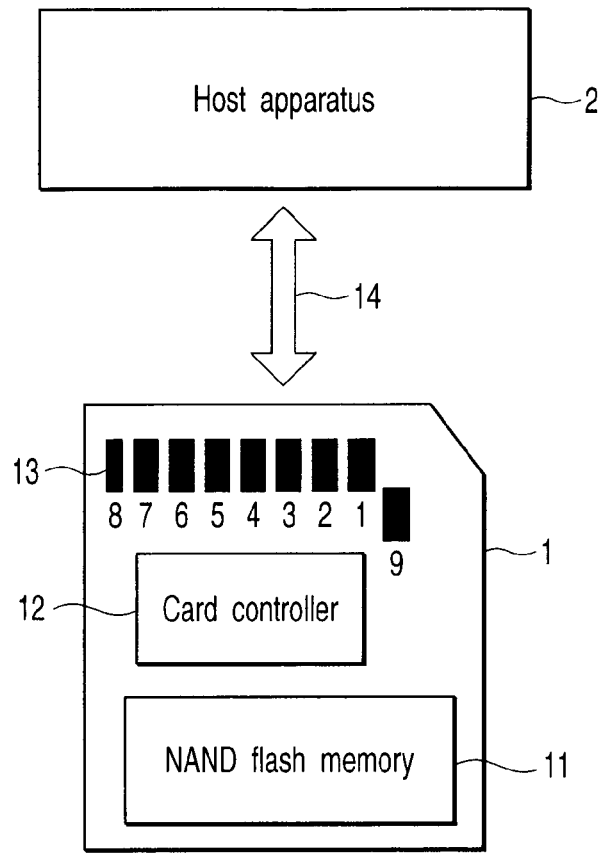
FIG. 1 is a block diagram for explaining a semiconductor memory device according to an embodiment.
FIG. 2 is a table showing the assignment of signals to signal pins in the semiconductor memory device according to the embodiment.

An Embodiment of the present invention will be described below with reference to the accompanying drawing. In this description, common reference numerals denote common parts throughout the drawings.

An outline of a semiconductor memory device according to an embodiment of the present invention will be first described with reference to FIGS. 1 to 5. FIG. 1 is a block diagram for explaining the semiconductor memory device according to this embodiment. This embodiment exemplifies a memory card as the semiconductor memory device.

With reference to FIG. 1, a memory card 1 transmits/receives information to/from a host apparatus 2 via a bus interface 14. The memory card 1 comprises a NAND flash™ memory (to be merely referred to as a flash memory hereinafter) chip 11, a card controller 12 that controls the flash memory chip 11, and a plurality of signal pins (first to ninth pins) 13.

The plurality of signal pins 13 are electrically connected to the card controller 12. Signals are assigned to the plurality of signal pins 13, that is, the first to ninth pins, for example, as shown in FIG. 2.

Data 0 to 3 are assigned to the seventh pin, the eighth pin, the ninth pin, and the first pin, respectively. The first pin is also assigned to a card detection signal. Moreover, the second pin is assigned to a command. The third and sixth pins are assigned to a ground potential Vss. The fourth and fifth pins are assigned to a power supply potential Vdd and a clock signal, respectively.

The memory card 1 is formed so that it can be inserted/released into/from a slot provided in the host apparatus 2. A host controller (not shown) provided in the host apparatus 2 communicates various signals and data with the card controller 12 in the memory card 1 via the first to ninth pins. For example, when data are to be written to the memory card 1, the host controller transmits a write command to the card controller 12 via the second pin as a serial signal. In this case, in response to a clock signal supplied to the fifth pin, the card controller 12 loads the write command provided to the second pin.

As described above, the write command is serially input to the card controller 12 utilizing only the second pin. As shown in FIG. 2, the second pin assigned to a command input is arranged between the first pin for data 3 and the third pin for the ground potential Vss. The plurality of signal pins 13 and the corresponding bus interface 14 are used in communication between the memory card 1 and the host controller in the host apparatus 2.

On the other hand, an interface for a NAND flash™ memory is employed for communications between the flash memory 11 and the card controller 12. Accordingly, although not shown, the flash memory 11 and the card controller 12 are connected together by 8-bit input/output (I/O) lines.

For example, when the card controller 12 writes data to the flash memory 11, the card controller 12 sequentially inputs a data input command 80H, a column address, a page address, data, and a program command 10H to the flash memory 11 via the I/O lines. Here, "H" in the command 80H indicates a hexadecimal number. Actually, an 8-bit signal "10000000" is provided to the 8-bit I/O lines in parallel. That is, with the NAND flash™ memory interface, a command of plural bits is provided to the I/O lines in parallel.

Furthermore, with the NAND flash™ memory interface, commands and data are communicated to the flash memory 11 using the same I/O lines. Thus, an interface used to allow a host controller in the host apparatus 2 and the memory card 1 to communicate is different from the interface used to allow the flash memory 11 and the card controller 12 to communicate.

Figure 3:
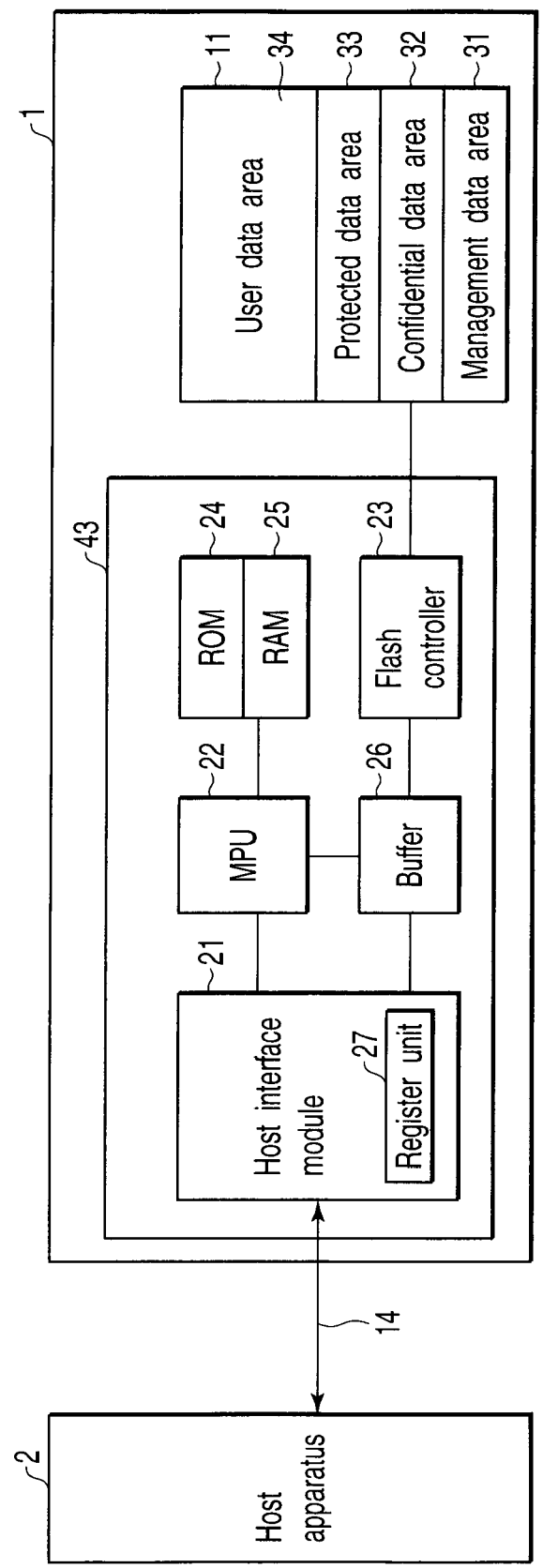
FIG. 3 is a block diagram showing the configuration of hardware in the semiconductor memory device according to the embodiment.

FIG. 3 is a block diagram showing the configuration of hardware in the memory card according to this embodiment.

As shown in FIG. 3, the host apparatus 2 comprises hardware and software used to access the memory card 1 connected to the apparatus 2 via the bus interface 14. The memory card 1 is operated by power supplied when connected to the host apparatus 2, and executes a process in accordance with an access from the host apparatus 2.

As described above, the memory card 1 includes the flash memory 11 and the card controller 12. For the flash memory 11, the erasure block size (a block size for an erasure unit) is set at a predetermined value (e.g., 256 kB). Furthermore, data are written/read out to/from the flash memory 11 using units (e.g., 2 kB) called pages.

The card controller 12 controls the internal physical state (e.g., which logical sector address data is contained in which physical block address, or which blocks are in the erase state) of the flash memory 11. The card controller 12 has a host interface module 21, MPU (Micro Processing Unit) 22, flash controller 23, ROM (Read-Only Memory) 24, RAM (Random Access Memory) 25, and buffer 26.

Figure 4:
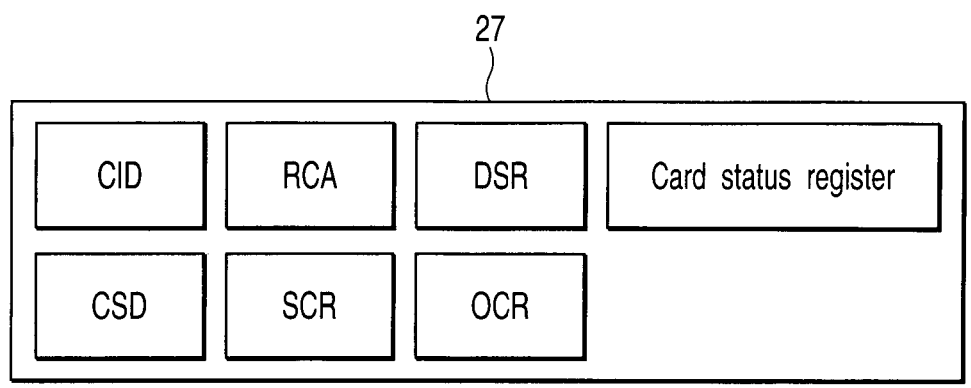
FIG. 4 is a block diagram showing, in detail, the configuration of a register unit of the semiconductor memory device according to the embodiment.

The host interface module 21 interfaces the card controller 12 and the host apparatus 2 together, and includes a register unit 27. FIG. 4 shows the configuration of the register unit 27 in detail. The register unit 27 has various registers including a card status register, CID, RCA, DSR, CSD, SCR, and OCR.

These registers are defined as described below. The card status register is used for normal operations and stores, for example, error information (to be described later). CID, RCA, DSR, CSD, SCR, and OCR are mainly used to initialize the memory card.

CID (Card IDentification number) stores the serial number of the memory card 1. RCA (Relative Card Address) stores a relative card address (dynamically determined by the host apparatus during initialization). DSR (Driver Stage Register) stores the bus driving force of the memory card 1 and the like.

CSD (Card Specific Data) stores characteristic parameter values of the memory card 1, and saves version information, a performance identification code, and a performance parameter according to the first embodiment.

SCR (SD Configuration data Register) stores the arrangement of data in the memory card 1. OCR (Operation Condition Register) stores an operation voltage if the memory card has a limited operational range voltage.

The MPU 22 controls the operation of the whole memory card 1. When, for example, the memory card 1 is supplied with power, the MPU 22 reads out firmware (control program) stored in the ROM 24 and loads it onto the RAM 25. The MPU 22 then executes a predetermined process to create various tables on the RAM 25.

The MPU 22 also receives a write command, read command, erasure command from the host apparatus 2. The MPU 22 then executes a predetermined process on the flash memory 11, or controls a data transfer process via the buffer 26.

The ROM 24 stores, for example, control programs controlled by the MPU 22. The RAM 25 is used as a work area for the MPU 22 to store control programs and various tables. The flash controller 23 executes an interfacing process between the card controller 12 and the flash memory 11.

The buffer 26 temporarily stores a specified amount of data (for example, for one page) when data sent by the host apparatus 2 are written to the flash memory 11. The buffer 26 also temporarily stores a specified amount of data when data read from the flash memory 11 are transmitted to the host apparatus 2.

Figure 5:
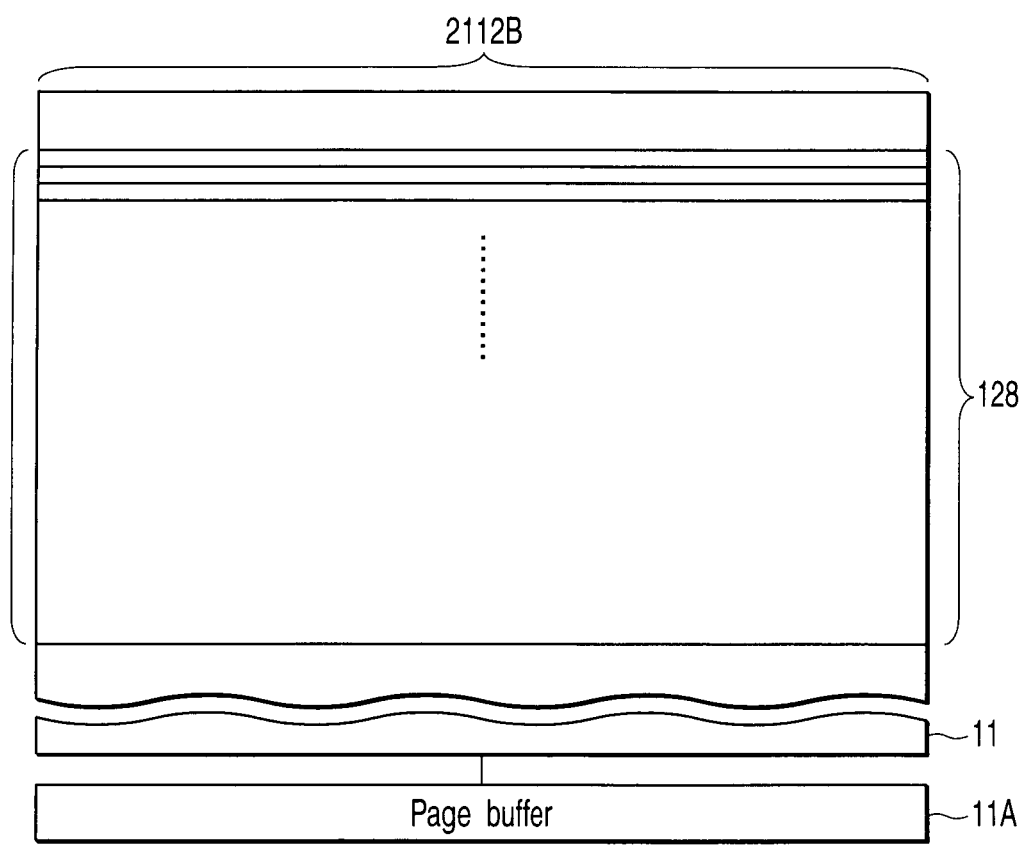
FIG. 5 is a view showing the arrangement of data in a flash memory of the semiconductor memory device according to the embodiment.

FIG. 5 shows the arrangement of data in the flash memory 11 of the memory card 1. With reference to FIG. 5, each page of the flash memory 11 has 2,112 B (512 B of data storage unit×4+10 B of redundant unit×4+24 B of management data storage unit). One erasure unit corresponds to 128 pages (256 kB+8 kB (in this case, 1 k=1,024 B)). Note that in the following description, the erasure unit of the flash memory 11 is 256 kB for descriptive convenience.

The flash memory 11 comprises a page buffer 11A used to input/output data to/from the flash memory 11. The storage capacity of the page buffer 11A is 2,112 B (2,048 B+64 B).

For a data write or the like, the page buffer 11A inputs/outputs data to/from the flash memory 11 for each page equal to its own storage capacity.

If the storage capacity of the flash memory 11 is, for example, 1 Gbit, the number of 256-kB blocks (erasure unit) is 512.

FIG. 5 illustrates the case in which the erasure unit is a 256-kB block. However, it is also effective in a practical sense to construct the memory so that the erasure unit is, for example, a 16-kB block. In this case, each page has 528 B (512 B of data storage unit+16 B of redundant unit). One erasure unit corresponds to 32 pages (16 kB+0.5 kB).

As shown in FIG. 3, an area of the flash memory 11 in which data is written (data storage area) is divided into a plurality of areas in accordance with the type of data saved. The flash memory 11 comprises, as data storage areas, a management data area 31, confidential data area 32, protect data area 33, and user data area 34.

The management data area 31 mainly stores management information associated with the memory card, i.e., card information such as the security information or media ID of the memory card 1.

The confidential data area 32 stores key information used for encryption, and confidential data used for authentication. The host apparatus 2 cannot access the confidential data area 32.

The protect data area 33 stores important data, and can be accessed only if the host apparatus 2 is proved to be valid on the basis of the mutual authentication between the memory card 1 and the host apparatus 2 connected to the memory card 1.

The user data area 34 stores user data, and can be freely accessed and used by the user of the memory card 1.

<Memory Space>

The memory space and data format of the NAND flash memory 11 according to this embodiment will be described next with reference to FIGS. 6 to 10.

In this embodiment, the NAND flash memory 11 based on the address translation table (L2P (Logical to Physical) table) scheme will be described. Note that the address translation table (L2P table) scheme is a scheme of associating, in a one-to-one correspondence, a logical block address (LBA) used when the host apparatus 2 externally accesses the memory card 1 with a physical block address (PBA) in the NAND flash memory 11.

An address translation table (L2P table) stores table information representing which logical block address corresponds to which physical block address in shipping the card 1.

The logical block address (LBA) is a block address which is issued and managed by the host apparatus 2.

The physical block address (PBA) is an actual block address in the NAND flash memory 11.

Figure 6:
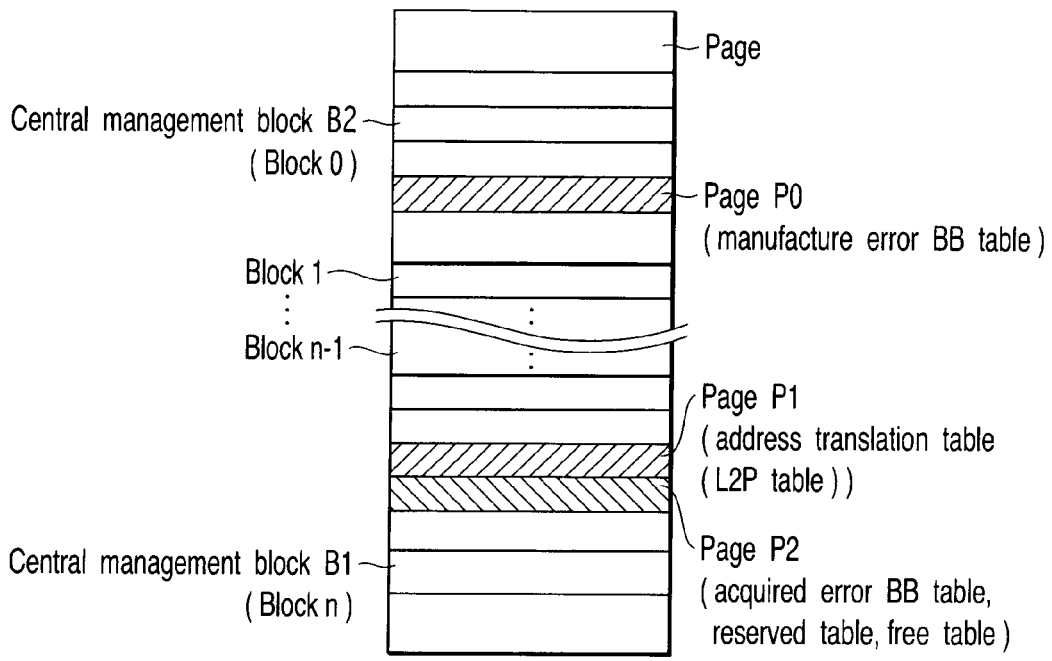
FIG. 6 is a view showing a memory space in the flash memory of the semiconductor memory device according to the embodiment.

With reference to FIG. 6, the NAND flash memory 11 has Block 0 to Block n+1 serving as minimum erasure units. In each of Block 0 to Block n+1, one minimum write unit corresponds to 32, 256, or 512 pages.

The NAND flash memory 11 also has central management blocks B1 (Block n) and B2 (Block 0) of Block 0 to Block n+1.

The central management block B1 (Block n) contains pages P1 and P2.

The page P1 includes the address translation table (to be referred to as the L2P table hereinafter). As described above, the L2P table is table information representing which logical block address corresponds to which physical block address.

The page P2 includes a free block address table, bad block (bad area) address table, and reserved block address table. These tables are respectively called a free table, BB table, and reserved table.

The free table registers only effective block addresses. The BB table registers the block addresses (bad block addresses) which are disabled by a newly acquired error. The reserved table is a table required for an operation (to be described later).

The central management block B2 (Block 0) has a page P0.

The page P0 stores the BB table which is a table for registering a bad block address which is disabled by an error upon manufacture. More specifically, the BB table stored in the page P0 is different from that stored in the page P2 in that the BB table in the page P0 registers bad block addresses which have been found in advance in a function test for checking whether the sealed NAND flash memory 11 can normally operate.

The plurality of tables (the L2P table, free table, acquired error BB table, and reserved table) stored in the central management block B1 are allocated on the RAM 25 in a write operation and the like (to be described later), and managed by the MPU 22 in the controller 12. On the other hand, the manufacture error BB table stored in the central management block B2 is not allocated on the RAM.

As described above, the NAND flash memory 11 requires the plurality of tables because data cannot be rewritten for each page P in the NAND flash memory 11, and data need be written after erasing data in Block 0 to Block n+1.

For example, when data in a given page of Block 1 is rewritten, control is made to copy, into a block other than Block 1, a page to be newly rewritten and data not to be rewritten in the Block 1. That is, data is copied into a different block, e.g., Block 2.

As described above, data to be rewritten is written in a block other than the block which is used before the rewrite operation. Hence, when rewriting data, the correspondence relationship between the logical block address (LBA) and the physical block address (PBA) corresponding to the logical block address dynamically changes every rewrite process. Accordingly, the block address translation table (L2P table) translates the logical block address (LBA) to the physical block address (PBA) to specify Block 0 to Block n+1 to be actually accessed, based on the physical block address (PBA).

Figure 7:
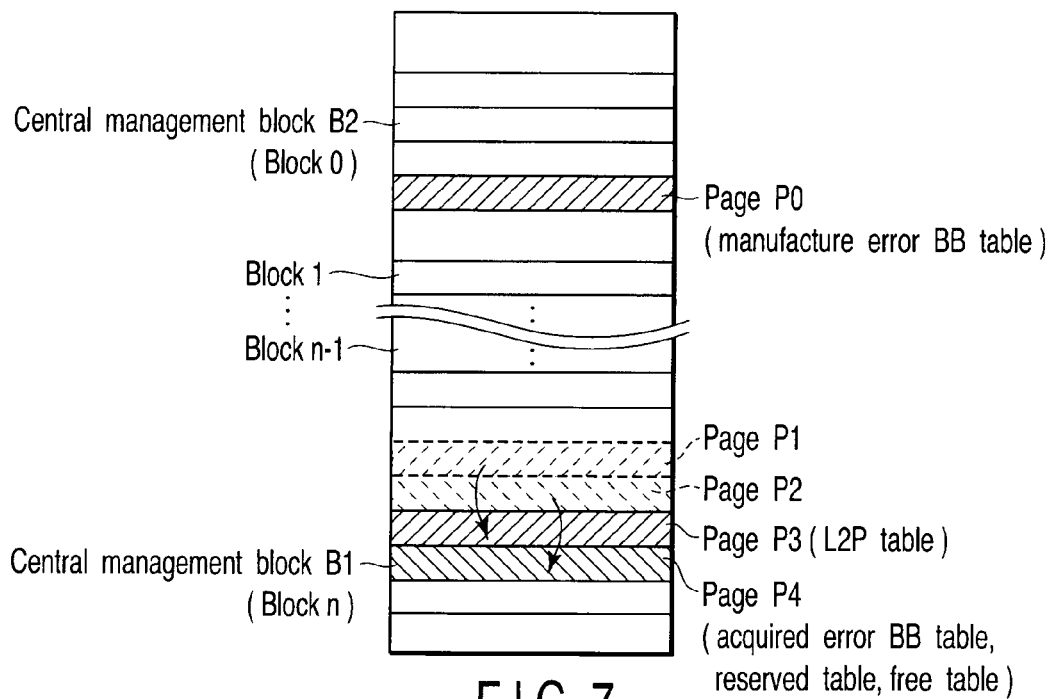
FIG. 7 is a view showing a memory space in an updated flash memory of the semiconductor memory device according to the embodiment.

As a result, as shown in FIG. 7, when rewriting data, the L2P table stored in the page P1 moves to, e.g., a page P3 after updating the correspondence relationship between portions associated with the rewrite operation.

For the same reason, when rewriting data, the BB table, reserved table, and free table stored in the page P2 move to, e.g., a page P4 after updating the correspondence relationship between portions associated with the rewrite operation.

The controller 12 additionally stores data in the central management block B1 (Block n) of the NAND flash memory 11 whenever the L2P table, free table, and the like change.

As described above, data cannot be overwritten because of the characteristics of the NAND flash memory 11. Hence, when writing data in the same logical block address (data overwrite), data need be overwritten by assigning the data to another physical block address.

Figure 8:
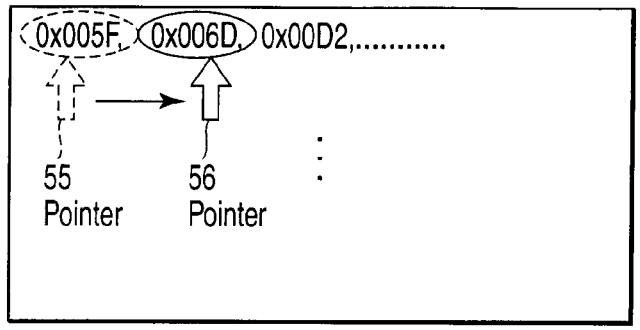
FIG. 8 is a view showing a data format in a free table according to the embodiment.

In this embodiment, for example, FIG. 8 shows the data format of the free table. As shown in FIG. 8, usable (writable/erasable) block information is expressed based on a 2-byte physical block address. This table registers only block addresses other than the manufacture error bad block addresses. That is, this table registers only effective block addresses.

As described above, since the block information is formatted in physical block address expression, the controller 12 can move a pointer in an operation (to be described later). With this operation, table information (address data) to be sequentially used need not be detected. For example, the controller 12 moves a pointer 55 of table information 0x005F to a pointer 56 of table information 0x006D after a predetermined operation.

Figure 9:
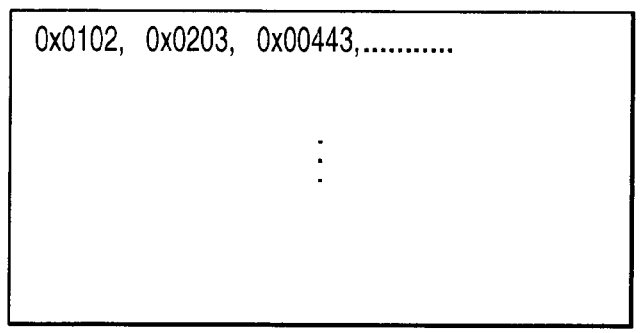
FIG. 9 is a view showing a data format in a BB table according to the embodiment.

For example, FIG. 9 shows the data format of the BB table. As shown in FIG. 9, the block information as the bad block address is expressed based on a 2-byte physical block address. The BB table comprises the manufacture error and acquired error BB tables as described above.

Figure 10:
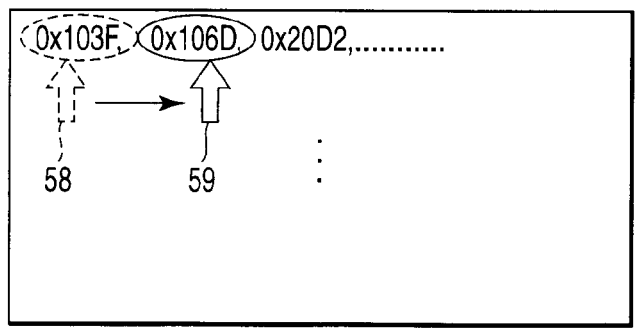
FIG. 10 is a view showing a data format in a reserved table according to the embodiment.

For example, FIG. 10 shows the data format of the reserved table. As shown in FIG. 10, the block address information which can be substituted when a bad block is generated is expressed based on a 2-byte physical block address.

As described above, the block information is formatted in the physical block address expression, and the controller 12 can move the pointer in an operation (to be described later). Hence, table information (address data) to be sequentially used need not be detected. For example, the controller 12 moves a pointer 58 of table information 0x103F to a pointer 59 of table information 0x106D after a predetermined operation.

<Table Management Operation in Rewriting>

The table management operation to be performed in the rewrite operation of the NAND flash memory 11 according to this embodiment will be described with reference to FIGS. 11 to 13. This table management operation is executed in a RAM space in which various tables such as the L2P table stored in the pages P0 to P2 are allocated on the RAM 25. The following description will be done in accordance with the flowchart of FIG. 11.

(Step ST1)

Figure 12:
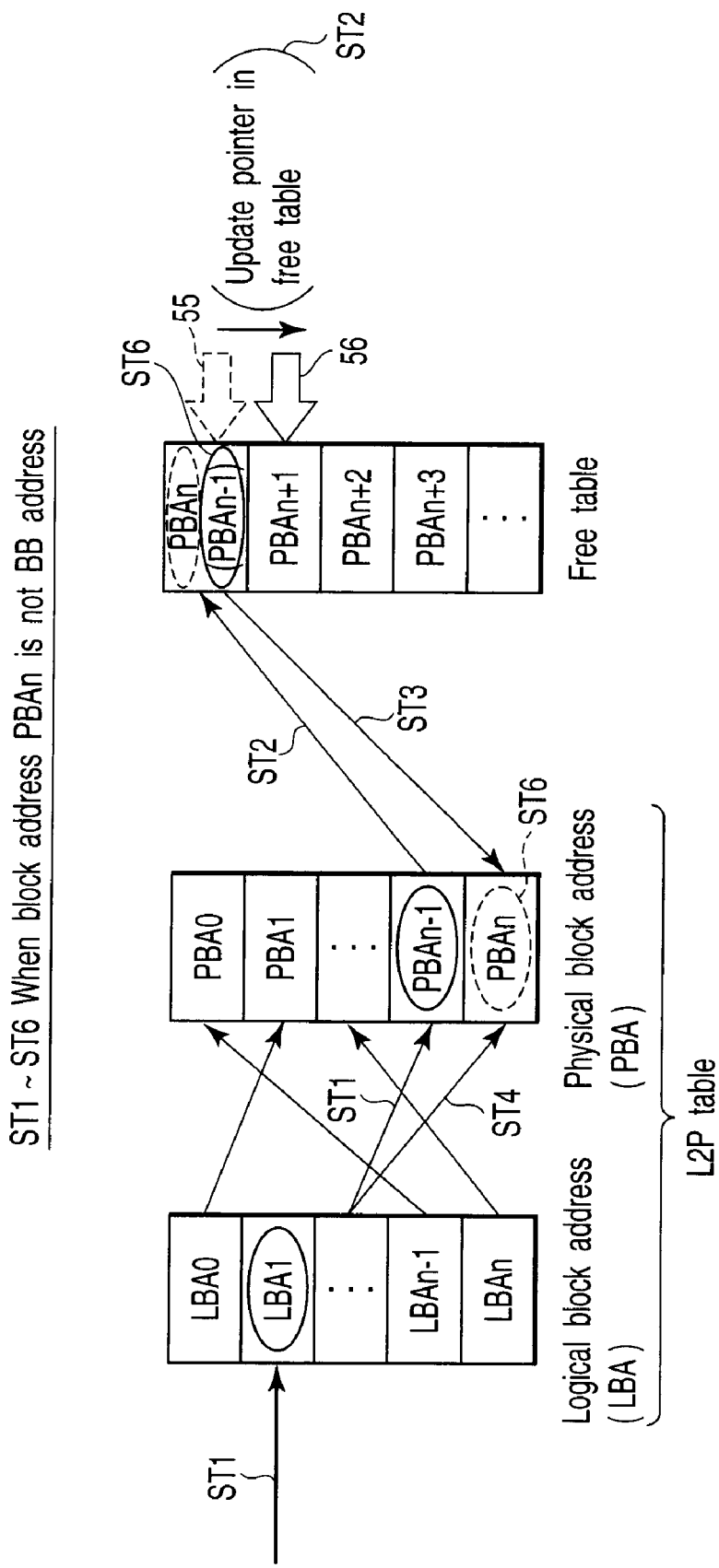
FIG. 12 is a view showing table management operations (ST1 to ST6) of the semiconductor memory device according to the embodiment.

As shown in FIG. 12, assume that the rewrite process is performed for a logical block address (LBA) LBA1 designated by the host apparatus 2.

In this case, the MPU 22 refers to a free block address in the free table in order to update the erasure block corresponding to the logical block address LBA, e.g., a physical block address PBAn-1.

(Step ST2)

As shown in FIG. 12, the MPU 22 immediately recognizes, as an effective block, the block address which has been referred to in the free table, and acquires a block address PBAn.

In this case, the MPU 22 updates the position of the free table pointer in the free table (pointer 55→pointer 56). Unless the position of the free table pointer is updated, data is overwritten to the free block address PBAn-1 in the sequential rewrite operation. The MPU 22 updates the position to prevent such rewrite operation.

(Step ST3 (Whether Assigned Physical Block Address is BB Address?))

The MPU 22 then confirms whether the physical block address PBAn which is sequentially assigned and reserved can be normally written. That is, the MPU 22 confirms whether the physical block address PBAn which is sequentially assigned and reserved is a bad block address (newly acquired error bad block address or newly acquired error bad area) because of a non-correctable ECC error, write error, erase error, or the like.

(Step ST6)

As shown in FIG. 12, when the above-described physical block address PBAn is not a bad block address, the MPU 22 then directly uses the physical block address PBAn which is assigned and reserved as the next block address in the L2P table, and registers the block address PBAn in the L2P table. After that, the MPU 22 registers, in the free table, the block address PBAn-1 which has been used.

(Step ST4)

Figure 13:
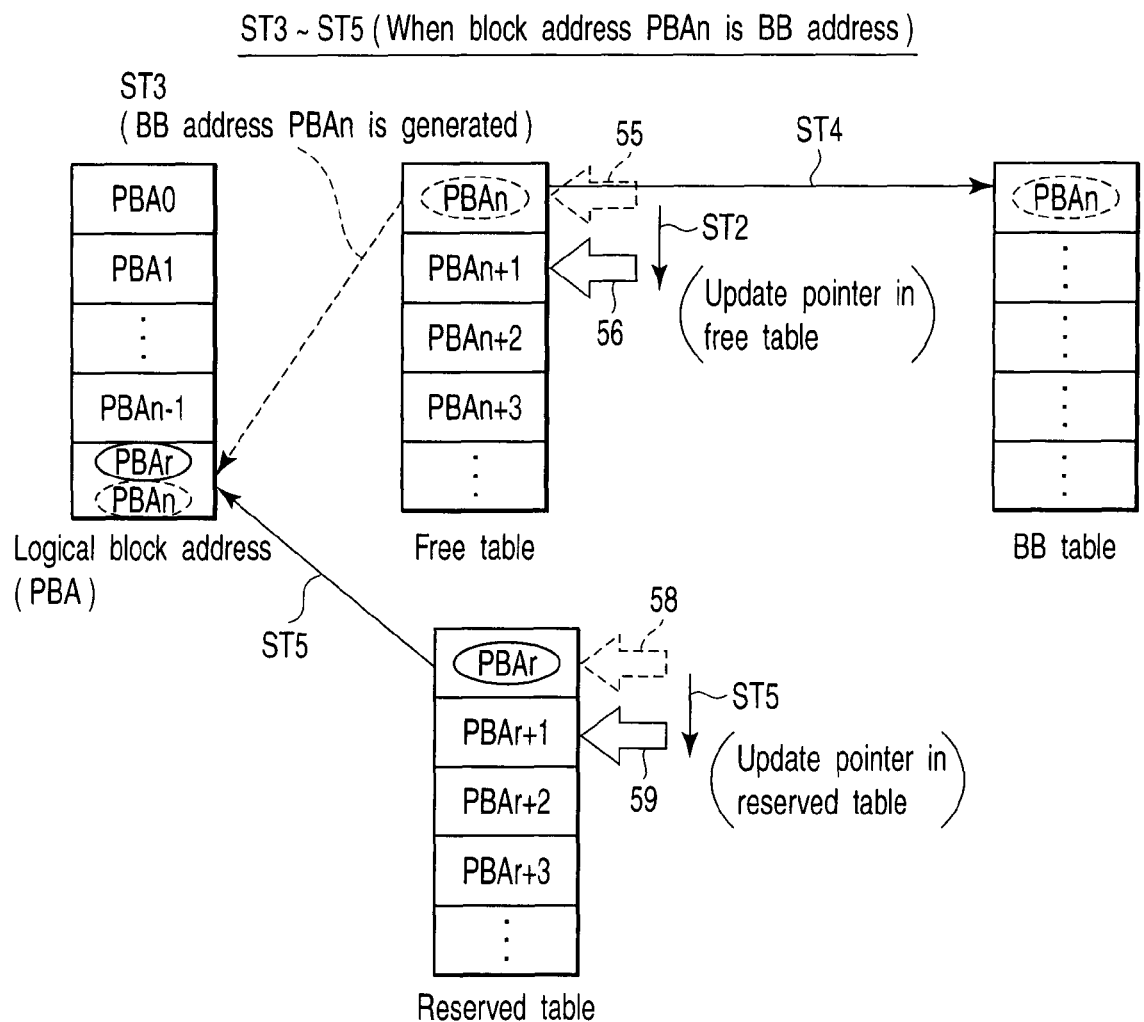
FIG. 13 is a view showing table management operations (ST3 to ST5) of the semiconductor memory device according to the embodiment.

On the other hand, when the above-described physical block address PBAn is a bad block address, as shown in FIG. 13, the MPU 22 recognizes the block address PBAn as the bad block address. The MPU 22 then separately registers the block address PBAn as a newly assigned block address PBAn in the BB address table.

(Step ST5)

When the physical block address PBAn is a bad block address, as shown in FIG. 13, the MPU 22 acquires a substitution block address PBAr from the reserved table, and registers it in the L2P table. That is, the MPU 22 acquires a normal block address from the reserved table. In this case, the MPU 22 updates the position of a reserved table pointer in the reserved block address table (pointer 58 pointer 59).

After that, the MPU 22 repeats operations in step ST1 and subsequent steps, and performs the table management operation in rewriting data in the NAND flash memory 11.

The above-described semiconductor memory device and control method thereof according to this embodiment have at least the following effects (1) and (2).

(1) The numbers of determination and detection processes can be reduced, and the processing speed can be increased.

As described above, the semiconductor memory device according to this embodiment includes the central management block B1 (first central management block) which stores the L2P table, free table, acquired error BB table, and reserved table. The free table registers only effective block addresses.

The MPU 22 can immediately recognize, as an effective block, the block address which has been referred to in the free table, and can acquire the block address PBAn (step ST2). That is, the MPU 22 need not determine whether the block address in the free table is an effective block in step ST2. As a result, the determination process can be eliminated in step ST2, and the processing speed of the semiconductor memory device can be increased.

The central management block B1 stores the reserved table.

Thus, when the physical block address PBAn is a bad block address (step ST4), the MPU 22 can acquire, from the reserved table, a substitution block address PBAr for the block address PBAn (step ST5).

Accordingly, the MPU 22 can immediately acquire a substitution block address even when the physical block address PBAn is a bad block address.

On the other hand, conventionally, when a bad block address is generated, the MPU 22 acquires a substitutable block address from remaining tables such as the BB table other than the L2P table. Hence, it has been necessary to perform the detection process of detecting a substitutable block address from all tables other than the L2P table.

However, in this embodiment, the central management block B1 stores the reserved table in which substitution block addresses which can be substituted when a back block address is generated are assigned in advance.

Therefore, the MPU 22 need not perform the detection process of detecting a substitutable block address from all tables even when a bad block address is generated (step ST4). As a result, the number of detection processes can be decreased, and the processing speed can be increased.

As described above, according to this embodiment, one determination process and one detection process can be omitted for each rewrite operation. These determination and detection processes need be frequently performed in a normal rewrite operation of write/erase access. Hence, this embodiment can contribute to improvement of the performance of the high-speed operation of the entire memory.

Furthermore, in the table management operation according to this embodiment, the numbers of determination and detection processes can be reduced, thereby simplifying the table management operation. This can advantageously reduce the design load of the controller 12.

(2) The rewrite operation can be prevented from concentratedly being executed in some physical blocks, and the number of rewrite operations can be equalized.

As described above, in step ST2, the MPU 22 updates the position of the free table pointer in the free table (pointer 55→pointer 56). Upon updating the position of the free table pointer, data can be prevented from being overwritten in the free block address PBAn−1. In step ST5, the MPU 22 then updates the position of the reserved table pointer in the reserved block address table (pointer 58→pointer 59).

Upon updating the position of the pointer, some block addresses in the free and reserved tables can be distributively used. Hence, it can be prevented from concentratedly performing the rewrite operation of write/erase access in some physical blocks in the NAND flash memory 11, thereby equalizing the number of rewrite operations. When the rewrite operations are concentratedly performed in some physical blocks, the quality of the memory cells in the physical blocks becomes low. The quality of the memory cells in the physical blocks can be prevented from degrading upon equalizing the number of rewrite operations.

As described above, the MPU 22 can update the pointer because the free table, BB table, and reserved table are formatted in physical block address expression as shown in FIGS. 8 to 10.

On the other hand, conventionally, an AT table (assign table) and a BB table are formatted in a bit expression of eight blocks per byte as shown in FIGS. 14 and 15. Hence, the conventional semiconductor memory device has no reference position information to be sequentially used, and need to perform a calculation process of detecting blocks.

Since the free table, BB table, and reserved table are formatted in physical block address expression, the calculation process of detecting blocks can be omitted, and the position of the pointer can be updated.

In this embodiment, the L2P table sequentially registers the addresses of the physical block address (PBA). However, these addresses need not be always registered sequentially. For example, in this embodiment, the L2P table sequentially registers the physical block addresses PBA0, . . . , PBAn as shown in FIGS. 12 and 13. However, the same effects can be acquired when the L2P table registers the physical block addresses PBA1, PBAn+1, . . . , PBA0 at random.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a semiconductor memory which includes a first central management block storing an address translation table, a free table for registering only an effective block address, a first bad block table, and a reserved table; and
   a controller which, when a bad block address is generated in the address translation table, acquires a substitution block address from the reserved table to substitute the substitution block address for the bad block address, without searching each of the first bad block table and the reserved table for an effective block address.

2. The device according to claim 1, wherein the controller registers the bad block address in the first bad block table when the bad block address is generated in the address translation table.

3. The device according to claim 1, wherein the first bad block table is a table which registers an acquired error bad block address.

4. The device according to claim 1, wherein block information is expressed in a physical block address expression in the free table.

5. The device according to claim 1, wherein the free table registers only a block address other than a manufacture error bad block address.

6. The device according to claim 1, wherein the semiconductor memory further comprises a second central management block which stores a second bad block table for registering a manufacture error bad block address.

7. The device according to claim 1, wherein the controller includes a host interface module, an MPU, a flash controller, a ROM, a RAM, and a buffer.

8. The device according to claim 7, wherein the host interface module interfaces the controller and an external apparatus, and includes a register unit.

9. The device according to claim 8, wherein the register unit includes a card status register, and a plurality of registers.

10. A control method of a semiconductor memory device having a semiconductor memory which includes a central management block storing an address translation table, a free table for registering only an effective block address, a bad block table, and a reserved table, and a controller, the method comprising:
    causing the controller to register a bad block address in a first bad block table when the bad block address is generated in the address translation table;
    acquiring a substitution block address from the reserved table without searching each of the first bad block table and the reserved table for an effective block address; and
    substituting the substitution block address for the bad block address.

11. The method according to claim 10, further comprising causing the controller to update a pointer in the free table when registering the bad block address in the bad block table.

12. The method according to claim 10, further comprising updating a pointer in the reserved table when acquiring the substitution block address.

13. The method according to claim 10, wherein the first bad block table is a table which registers an acquired error bad block address.

14. The method according to claim 10, wherein block information is expressed in a physical block address expression in the free table.

15. The method according to claim 10, wherein the free table registers only a block address other than a manufacture error bad block address.

16. The method according to claim 10, wherein the semiconductor memory further comprises a second central management block which stores a second bad block table for registering a manufacture error bad block address.

17. The method according to claim 10, wherein the controller includes a host interface module, an MPU, a flash controller, a ROM, a RAM, and a buffer.

* * * * *